United States Patent [19]
Banholzer et al.

[11] Patent Number: 5,508,071
[45] Date of Patent: Apr. 16, 1996

[54] CVD DIAMOND COATING ANNULUS COMPONENTS AND METHOD OF THEIR FABRICATION

[75] Inventors: William F. Banholzer, Scotia; Roger N. Johnson, Hagaman; Gary L. Leonard, Schenectady; Richard L. Mehan, Scotia; Clifford L. Spiro, Niskayuna, all of N.Y.

[73] Assignee: General Electric Company, Worthington, Ohio

[21] Appl. No.: 127,964

[22] Filed: Sep. 28, 1993

Related U.S. Application Data

[62] Division of Ser. No. 464,818, Jan. 16, 1990, abandoned.

[51] Int. Cl.⁶ .................................................. B05D 3/00
[52] U.S. Cl. .................. 428/34.4; 427/255.1; 427/249; 427/398.3; 118/724; 118/69
[58] Field of Search .............................. 427/255.1, 242, 427/250, 213, 249, 237, 398.1, 398.3; 428/34.4; 118/724, 69, 105

[56] References Cited

U.S. PATENT DOCUMENTS

| | | | |
|---|---|---|---|
| 4,816,286 | 3/1989 | Hirose | 427/39 |
| 4,960,643 | 10/1990 | Lemelson | 428/408 |
| 5,180,571 | 1/1993 | Hosoya et al. | 423/446 |
| 5,314,652 | 5/1994 | Simpson et al. | 264/81 |

FOREIGN PATENT DOCUMENTS

421276A2  9/1989  Germany.

*Primary Examiner*—Charles R. Nold

[57] ABSTRACT

In its broadest aspects, the present invention is directed to a method for improving the abrasion resistance of the annular interior surface of an annulus. Such method comprises the steps of (a) placing said annulus heated to an elevated CVD diamond-forming temperature in a vacuum chamber held under reduced pressure; (b) providing a hydrocarbon/hydrogen gaseous mixture within said chamber; (c) at least partially decomposing said gaseous mixture in said chamber; and (d) directing said at least partially decomposed gaseous mixture into said heated annular interior for diamond deposition/growth to occur on said annular interior surface. As noted above, spray nozzles, valves, injectors, wire drawing dies, and like annular products are ideally suited for use in accordance with the precepts of the present invention.

11 Claims, No Drawings

CVD DIAMOND COATING ANNULUS COMPONENTS AND METHOD OF THEIR FABRICATION

This is a divisional of application Ser. No. 07/464,818 filed on Jan. 16, 1990, now abandoned.

BACKGROUND OF THE INVENTION

The present invention relates to annular components in which the annular interior surface is subjected to abrasive conditions during use and more particularly to improving the abrasion resistance of such annular interior surface.

Its hardness and thermal properties are but two of the characteristics that make diamond useful in a variety of industrial components. Initially, natural diamond was used in a variety of abrasive applications. With the ability to synthesize diamond by high pressure/high temperature (HP/HT) techniques utilizing a catalyst/sintering aid under conditions where diamond is the thermally stable carbon phase, a variety of additional products found favor in the marketplace. Polycrystalline diamond compacts, often supported on a tungsten carbide support in cylindrical or annular form, extended the product line for diamond additionally. However, the requirement of high pressure and high temperature has been a limitation in product configuration, for example.

Recently, industrial effort directed toward the growth of diamond at low pressures, where it is metastable, has increased dramatically. Although the ability to produce diamond by low-pressure synthesis techniques has been known for decades, drawbacks including extremely low growth rates prevented wide commercial acceptance. Recent developments have led to higher growth rates, thus spurring recent industrial interest in the field. Additionally, the discovery of an entirely new class of solids, known as "diamond like" carbons and hydrocarbons, is an outgrowth of such recent work.

Low pressure growth of diamond has been dubbed "chemical vapor deposition" or "CVD" in the field. Two predominant CVD techniques have found favor in the literature. One of these techiques involves the use of a dilute mixture of hydrocarbon gas (typically methane) and hydrogen wherein the hydrocarbon content usually is varied from about 0.1% to 2.5% of the total volumetric flow. The gas is introduced via a quartz tube located just above a hot tungsten filament which is electrically heated to a temperature ranging from between about 1750° to 2150° C. The gas mixture disassociates at the filament surface and diamonds are condensed onto a heated substrate placed just below the hot tungsten filament. The substrate is held in a resistance heated boat (often molybdenum) and heated to a temperature in the region of about 500° to 1100° C.

The second technique involves the imposition of a plasma discharge to the foregoing filament process. The plasma discharge serves to increase the nucleation density, growth rate, and it is believed to enhance formation of diamond films as opposed to discrete diamond particles. Of the plasma systems that have been utilized in this area, there are three basic systems. One is a microwave plasma system, the second is an RF (inductively or capacitively coupled) plasma system, and the third is a d.c. plasma system. The RF and microwave plasma systems utilize relatively complex and expensive equipment which usually requires complex tuning or matching networks to electrically couple electrical energy to the generated plasma. Additionally, the diamond growth rate offered by these two systems can be quite modest.

Despite the significant advances reported in the CVD art, one problem has plagued most of these processes—adhesion of the diamond film to the substrate. It is not uncommon for the CVD diamond layer to spall from the substrate, especially upon cooling of the substrate. The difference in coefficient of thermal expansion between diamond and the substrate often leads to interlayer stresses that make spalling an inevitable result.

BROAD STATEMENT OF THE INVENTION

The present invention is an outgrowth of attempts to improve the abrasion resistance of flow control components, including spray nozzles, valves, injectors, and the like. Subsequent thereto, the invention was expanded to a variety of additional annular products wherein the interior annular surface is subjected to abrasive conditions, e.g. wire drawing dies. Fortuitously, work on the present invention resulted in the realization that a product configuration existed wherein the difference in coefficient of thermal expansion between the substrate and the CVD diamond layer would actually promote retention of the diamond layer by the substate, rather than the spalling of the diamond layer from the substrate. Accordingly, in its broadest aspects, the present invention is directed to a method for improving the abrasion resistance of the annular interior surface of an annulus. Such method comprises the steps of (a) placing said annulus heated to an elevated CVD diamond-forming temperature in a vacuum chamber held under reduced pressure; (b) providing a hydrocarbon/hydrogen gaseous mixture within said chamber; (c) at least partially decomposing said gaseous mixture in said chamber; and (d) directing said at least partially decomposed gaseous mixture into said heated annular interior for diamond deposition/growth to occur on said annular interior surface. As noted above, spray nozzles, valves, injectors, wire drawing dies, and like annular products are ideally suited for use in accordance with the precepts of the present invention.

The annular product fabricated in accordance with the foregoing method forms yet another aspect of the present invention. Such annular product comprises an annulus which has at least a portion of its annular interior surface coated with a layer of CVD diamond which has been formed by a CVD process. The annular interior diamond layer is placed in compression by virtue of the difference in coefficient of thermal expansion between the annulus material and the CVD diamond layer. Such thermal "mismatch" contributes to retention of the CVD diamond layer. The abrasion resistance of the diamond layer, then, results in an annular product having improved abrasion resistance. The exterior of the annular product need not be coated with a layer of CVD diamond, though it may be.

Advantages of the present invention include the ability to line the interior surface of an annular product with a layer of diamond for improving the abrasion resistance of the annular product. Another advantage is the ability to coat the annular interior surface of an annular product wherein the annular interior surface may exhibit non-cylindrical geometry. A further advantage of the present invention is a product configuration wherein the difference in materials results in improved retention of the inner diamond liner by the annulus of the annular product. These and other advantages will be readily apparent to those skilled in the art based upon the disclosure contained herein.

DETAILED DESCRIPTION OF THE INVENTION

The abrasion resistance of diamond is well known and has been utilized in a variety of product configurations, e.g.

annular polycrystalline diamond wire drawing dies. Thus, if the interior surface of an annulus could be coated with a layer of diamond, the abrasion resistance of such surface would be markedly improved. While it is possible to make a polycrystalline diamond compact by high pressure/high temperature techniques and insert such compact within a flow control component, e.g. spraying nozzle, clearly such fabrication technique has its limitations. It was a fortuitous discovery during the course of work on the present invention that one of the causes of CVD diamond spalling, i.e. a mismatch in coefficient of thermal expansion, could be turned into a positive benefit in the product configuration disclosed herein. For present purposes, then, "annulus" includes not only full 360° annuli of cylindrical or other configuration (e.g. octagonal, hexagonal, or the like), but also includes partial annuli, e.g. 270° or ¾ cylinders. So long as a sufficient concave surface is presented for exerting compression on the deposited CVD diamond layer, a useful laminate product structure of improved abrasion resistance results.

With respect to conventional CVD processes useful in the present invention, hydrocarbon/hydrogen gaseous mixtures are fed into a CVD reactor as an initial step. Hydrocarbon sources can include the methane series gases, e.g. methane, ethane, propane; unsaturated hydrocarbons, e.g. ethylene, acetylene, cyclohexene, and benzene; and the like. Methane, however, is preferred. The molar ratio of hydrocarbon to hydrogen broadly ranges from about 1:10 to about 1:1,000 with about 1:100 being preferred. This gaseous mixture optionally may be diluted with an inert gas, e.g. argon. The gaseous mixture is at least partially decomposed thermally by one of several techniques known in the art. One of these techniques involves the use of a hot filament which normally is formed of tungsten, molybdenum, tantalum, or alloys thereof. U.S. Pat. No. 4,707,384 illustrates this process.

The gaseous mixture partial decomposition also can be conducted with the assistance of d.c. discharge or radio frequency electromagnetic radiation to generate a plasma, such as prosposed in U.S. Pat. Nos. 4,749,587, 4,767,608, and 4,830,702; and U.S. Pat. No. 4,434,188 with respect to use of microwaves. The substrate may be bombarded with electrons during the CVD deposition process in accordance with U.S. Pat. No. 4,740,263.

Regardless of the particular method used in generating the partially decomposed gaseous mixture, the substrate is maintained at an elevated CVD diamond-forming temperature which typically ranges from about 500° to 1100° C. and preferably in the range of about 850° to 950° C. where diamond growth is at its highest rate in order to minimize grain size. Pressures in the range of from about 0.01 to 1000 Torr, advantageously about 100–800 Torr, are taught in the art, with reduced pressure being preferred. Details on CVD processes additionally can be reviewed by reference to Angus, et al., "Low-Pressure, Metastable Growth of Diamond and 'Diamondlike' Phases", *Science*, vol. 241, pages 913–921 (Aug. 19, 1988); and Bachmann, et al., "Diamond Thin Films", *Chemical and Engineering News*, pp. 24–39 (May 15, 1989).

With respect to the annulus, it will be appreciated that the materials of construction necessarily must be stable at the elevated CVD diamond-forming temperatures required by the CVD processing employed. Accordingly, appropriate substrates include, for example, metals (e.g. tungsten, molybdenum, silicon, and platinum), alloys, ceramics (e.g. silicon carbide, boron nitride, aluminum nitride), glasses, and carbon. It will be appreciated that the coefficient of thermal expansion of the annular substrate also should not be drastically higher than that of diamond in order to minimize the risk of fracturing the diamond layer deposited during the CVD processing. Because of the high temperatures involved during the CVD processing, it is believed that most stable annular substrates will have an appropriate coefficient of thermal expansion for implementation of the process. In this regard, it will be appreciated that the CVD diamond layer thickness laid down often will range from about 1 to 50 micrometers with about 10 to 20 micrometers being typical.

During the CVD processing, diamond growth occurs not only on the exposed surfaces, but also down the holes and along concave surfaces which may constitute the flow control unit. The gaseous mixture can be directed for selective growth/deposition of diamond only at desired locations of workpieces. When sufficient deposition has transpired, diamond growth is terminated by reducing the substrate temperature to ambient. This results in stresses between the diamond layer and the substrate since the thermal expansion coefficient of diamond is much less than that of metal or other annular substrate material. Often, the diamond coating will spontaneously spall from the surface; however, the diamond structure inside holes or other concave surfaces develops compressive forces so that the structure actually is strengthened by contraction, and therefore remains intact. This region often constitutes the zone of greatest wear since the greatest jet velocity and pressure-drop occurs here. Since diamond is the hardest known substance, this is precisely the region where diamond coverage is most desirable. These same comments hold true when an annular wire drawing die, for example, is being formed.

Further in this regard, diamond-coated nozzles most likely will find applications where wear is most critical. Wear can include tribological processes, chemical processes, or a combination thereof. However, the present invention should not be exclusively limited to spraying systems, but readily can be extended to any flow control component including nozzles, feed throughs, flow valves, extrusion die liners, pressing mold liners, sand blast liners, injection liners, and the like. As disclosed above, so long as a sufficient concave surface is presented, an "annulus" or "annular structure" for lining with CVD deposited diamond in accordance with the precepts of the present invention is appropriate.

The following example shows how the present invention has been practiced, but should not be construed as limiting. In this application, all gaseous percentages are molar and all units are in the metric system, unless otherwise expressly indicated. Also, all citations referred to herein are expressly incorporated herein by reference.

EXAMPLE

A spraying tip for a single hole coal-slurry fuel nozzle test specimen was fabricated out of molybdenum. This tip consisted of a 3.99 mm (0.157 in.) diameter disk which was 1.524 mm (0.06 in.) thick, and had a centrally located 0.381 mm (0.015 in.) diameter hole which had been electrodischarge machined. This tip was suspended 1.5 cm above a tungsten filament in an atmosphere comprising 1% methane and 99% hydrogen at 10 mm Hg pressure. A current of 29 amps was made to pass through the 20 mil diameter tungsten filament to achieve a temperature of ca. 2500° C. as measured by optical pyrometry.

The system was maintained in steady state for 25 hours, and then was rapidly quenched to ambient temperature. This quench cycle caused rapid and spontaneous spalling of the diamond from the exposed face of the nozzle, but not from the surfaces which constituted the cylindrical wall. On the face of the cylindrical wall was a coating of diamond ranging in thickness from 0.5 to 1.0 mils in thickness.

We claim:

1. A method for improving the abrasion resistance of the annular interior surface of an annulus having an exterior surface, which comprises the steps of:

(a) placing said annulus in a chamber and heating to an elevated CVD diamond-forming temperature;

(b) providing a hydrogen/hydrogen gaseous mixture within said chamber;

(c) at least partially decomposing said gaseous mixture in said chamber to form a CVD diamond layer on substantially the entire interior and exterior surface of said annulus; and (d) quenching said annulus by rapidly reducing the temperature of said annulus for removing said CVD diamond layer from said exterior surface of said annulus by spalling while retaining said CVD diamond layer on said interior surface of said annulus, said annulus being formed of a material having a higher coefficient of thermal expansion than diamond sufficient for enhancing retention of diamond within said annular interior surface due to compressive forces and removal of diamond on said exterior surface during said quenching due to spalling.

2. The method of claim 1 wherein the molar ratio of hydrocarbon to hydrogen in said gaseous mixture ranges from between about 1:10 and 1:1000.

3. The method of claim 2 wherein said gaseous mixture additionally comprises an inert gas.

4. The method of claim 1 wherein said pressure ranges from between about 100 and 800 Torr.

5. The method of claim 4 wherein said pressure ranges from between about 100 and 800 Torr.

6. The method of claim 1 wherein said annulus is heated to a temperature ranging from between about 500° and 1100° C.

7. The method of claim 6 wherein said annulus is heated to a temperature ranging from between about 850° and 950° C.

8. The method of claim 1 wherein said hydrocarbon of said gaseous mixture comprises methane.

9. The method of claim 1 wherein said gaseous mixture is at least partially decomposed by a filament manufactured from tungsten, molybdenum, tantalum, or an alloy thereof, held at a temperature ranging from between about 1500° C. and 2800° C.

10. The method of claim 1 wherein said annulus is manufactured from metal., an alloy, a ceramic, a glass, or carbon.

11. The method of claim 1 wherein said annular interior surface is coated with a layer of diamond ranging in thickness from between about 1 and 50 micrometers.

* * * * *